United States Patent
Gueret

[11] Patent Number: 5,401,113
[45] Date of Patent: Mar. 28, 1995

[54] APPLICATOR ASSEMBLY FOR A COSMETIC PRODUCT

[75] Inventor: Jean-Louis H. Gueret, Paris, France

[73] Assignee: L'Oreal, Paris, France

[21] Appl. No.: 194,384

[22] Filed: Feb. 10, 1994

[30] Foreign Application Priority Data

Feb. 10, 1993 [FR] France ................. 93 01453

[51] Int. Cl.⁶ .................................. A45D 33/12
[52] U.S. Cl. ........................... 401/208; 401/220
[58] Field of Search ............. 401/208, 220, 219

[56] References Cited

U.S. PATENT DOCUMENTS

| | | | |
|---|---|---|---|
| 1,756,935 | 5/1930 | Alland | 401/208 |
| 2,163,355 | 6/1939 | Sechrist | 401/208 |
| 2,276,047 | 3/1942 | Kurth . | |
| 2,625,701 | 1/1953 | Morrow et al. | 401/208 |
| 2,762,071 | 9/1956 | Eggert | 401/208 |
| 3,100,908 | 8/1963 | Engle | 401/220 |
| 3,103,689 | 9/1963 | Borisof | 401/208 X |
| 3,989,393 | 11/1976 | Frumkin et al. | 401/208 |
| 4,147,441 | 4/1979 | Harrison . | |
| 4,368,184 | 1/1983 | Drucker et al. . | |
| 4,459,058 | 7/1984 | Bennett | 401/88 |
| 4,930,919 | 6/1990 | Gueret | 401/129 X |

FOREIGN PATENT DOCUMENTS

| | | | |
|---|---|---|---|
| 512263 | 1/1921 | France . | |
| 1476039 | 2/1967 | France . | |
| 1524192 | 5/1968 | France . | |
| 571532 | 1/1958 | Italy | 401/208 |
| 55-076612 | 6/1980 | Japan . | |
| 399621 | 10/1933 | United Kingdom | 401/208 |
| 607478 | 8/1948 | United Kingdom | 401/208 |
| 1023517 | 3/1966 | United Kingdom | 401/208 |

Primary Examiner—Steven A. Bratlie
Attorney, Agent, or Firm—Young & Thompson

[57] ABSTRACT

Applicator assembly for a cosmetic product, comprising a container (2) holding the product, and an applicator device (5) consisting of at least one circular segment (53) made of flexible material, integral in terms of rotation with a spindle (6) via which it is mounted rotatably in a casing (3) which is integral with the container (2) holding the product, it being possible for the spindle (6) to be set in rotation from the outside. The casing (3) comprises two openings (32, 33), an inner opening (32) establishing a communication between the container (2) and the casing (3), and an outer opening (33) which opens towards the outside. The applicator device (5) is mounted movably between at least two positions, one position allowing the segment (53) of the applicator device (5) to come into contact with the product held in the container (2), and one position in which the segment (53) charged with product, is at least partially brought into line with the outer opening (33) so as to emerge from the casing (3) and serve for application of the product. The applicator device (5) has a tendency, as it from one to the other of the relates positions, to pack the product, which is therefore compacted on the applicator device (5).

16 Claims, 5 Drawing Sheets

APPLICATOR ASSEMBLY FOR A COSMETIC PRODUCT

FIELD OF THE INVENTION

The present invention relates to an applicator assembly for a cosmetic product such as, for example, a make-up powder product, the assembly comprising an applicator device and a container holding the product.

BACKGROUND OF THE INVENTION

It is well known that applying a make-up product such as, for example, face powder generally involves removing the product from a container, in particular a box, with the aid of an applicator which consists of a brush or a powder puff made of flexible material, in particular a flexible plastic foam, it being possible for the plastic foam to have been flocked.

This method of applying make-up has the disadvantage that the container or box and the applicator are independent, and it is possible to mislay one of these elements. Furthermore, when the product is a powder contained in a box, there is a risk of the powder being spilled when the user carries the box, if the latter is not sufficiently tight, or more particularly of the powder spilling at the moment when the user opens the box in order to remove the product. In addition, during removal of the product, some of the latter is often spilled by the user. Moreover, when the product is a loose powder, the latter has a tendency to blow off.

SUMMARY OF THE INVENTION

According to the present invention, it has been found that it is possible to avoid these disadvantages by using an assembly in which the container and the applicator are integral, the applicator device being flexible and capable of turning inside a casing which comprises two openings, one of these openings allowing a segment of the applicator device to remove the powder product from the container, and the other opening allowing the user, after rotation of the applicator device, to apply the product which has been removed by the said segment.

The present invention therefore relates to an applicator assembly for a cosmetic product, comprising a container holding the product, and an applicator device consisting of at least one circular segment made of flexible material, integral in terms of rotation with a spindle by means of which it is mounted rotatably in a casing which is integral with the container holding the product, it being possible for the spindle to be set in rotation from the outside, the casing of which assembly comprises two openings, an inner opening establishing a communication between the container and the casing, and an outer opening which opens towards the outside, characterized by the fact that the applicator device is mounted movably between at least two positions, one position allowing the segment of the applicator device to come into contact with the product held in the container, and one position in which the segment, charged with product, is at least partially brought into line with the outer opening in order to allow it to emerge from the casing and serve for application of the product, the applicator device having a tendency, as it passes by means of rotation from one to the other of the said positions, to pack the product, which is therefore compacted on the applicator device.

The cosmetic product can be a greasy or dry make-up powder; it can also be a pigmentary or particulate suspension in the form of a paste of greater or lesser fluidity.

Advantageously, in order to promote the compacting of the product on the applicator device, the segment of the applicator device is at least partially compressed in the direction of the rotation spindle in a zone between the inner opening and outer opening; the casing consists of a shell whose side walls are, in line with the zone, at a distance from one another which is smaller than the axial thickness of the segment of the flexible applicator device, the thickness being measured when the applicator device is free, not in use; alternatively, at least one pressure plate is arranged axially between a side wall of the shell and the segment of the applicator device; the pressure plate is advantageously integral with a pushbutton passing through the side wall of the shell and accessible from the outside by the user.

In order to facilitate the compacting of the product, the lower opening, formed on the lower edge of the shell, comprises notches formed in the side walls of the shell, the edge of the lower opening having the shape of a bevel inclined from the outside towards the inside over the entire perimeter of the lower opening, the segment of the applicator device being arranged in line with the notches. In this way the opening constitutes a sort of funnel in which the product, particularly when it is in powder form, has a tendency to pack as a result of gravity when the applicator assembly is in the position in which the container is at the top; moreover, the applicator device, while rotating, has a tendency to pack the product by means of a wedging effect: in this way the product, in particular a powdery product, is compacted on the applicator device. It is therefore possible to remove a larger quantity of product, and when the charged portion of the applicator device arrives, by means of rotation, at the level of the outer opening of the casing, the product, if it is powdery, is compacted and has virtually no tendency to blow off. The inner opening of the casing can be formed in such a way that only one side of the applicator device is charged with product; the other side can therefore be used as a shader.

The applicator assembly preferably comprises a cap fitted on the casing in such as way as to protect the segment of the applicator device arranged outside the casing.

The assembly according to the invention functions in the following manner: the user holds the applicator assembly in the position in which the container is at the top, in such a way that the applicator device is in contact with the powder product which has come by gravity into contact with the applicator device by means of the inner opening of the casing establishing a communication between the casing and the container. The user then turns the applicator device in the casing until the segment which was in contact with the product in the container appears in the outer opening of the casing. During this rotation, the segment passes through the zone of restriction and the product is compacted onto the applicator device. The user then applies the product, for example onto the faced using the segment which is exposed through the outer opening. With the assembly according to the invention, there is no risk of the user spilling the product during its removal from the container, and, when the product is a powder, there is no risk of the removed powder blowing off into the air.

According to a first variant, the applicator device can consist entirely of a flexible foam, in particular an open-cell or closed-cell plastic foam. According to another variant, the applicator device is made, in particular by injection, of a semi-flexible thermoplastic which has undergone a surface flocking treatment. According to a third variant, the applicator device consists of a circular hub of rigid material, on which a ring of flexible foam is fixed. When the surface of the applicator device is made of flexible foam, it can be flocked, at least partially, in such a way as to improve the contact with the skin during application and to permit shading of the product as easily as possible after application. The outer edge of the applicator device made of flexible foam can have, in a section through an axial plane, variable shapes adapted to its use upon application: this shape can be rounded, triangular or made up of two lips. According to a fourth variant, the applicator device consists of a hub of rigid material on which flexible hairs are radially fixed.

As indicated hereinabove, the applicator device can be activated from the outside by the user. The activating means preferably consists of at least one knurled wheel fixed to one end of the rotation spindle and arranged at least partially outside the casing. A suitable means preferably prevents any relative rotation of the applicator device with respect to the spindle. Alternatively, the activating means is the cap itself, fitted rotatably and integral in terms of rotation with the applicator device; according to another variant, it is an external lever permitting a reduction of the force required to overcome the constraint of the applicator device.

The rotation spindle preferably consists of two elements which can be engaged and which bear, after engagement, on the side wall of the casing or on an element integral with the side wall of the casing, in order to prevent, after engagement, any play of the spindle in translation, following engagement.

The shell is advantageously made in two parts and the applicator device is mounted in a removable manner in such a way that it is interchangeable.

The two openings of the casing are preferably arranged perpendicular to the longitudinal axis of the casing. The edges of the outer opening, freeing that part of the applicator device charged with product and being used for the application, are preferably situated in a plane perpendicular to the longitudinal axis of the casing. The inner opening establishing a communication between the container and the casing preferably comprises a notch in the side wall of the casing, having a curvilinear, trapezoidal or rectangular shape.

The container is fixed by any known means on the casing; it is preferably fixed in a removable manner so that it is possible to fix different containers on one and the same casing, either to refill the assembly with product or to modify the nature of the product used.

The container can be of any shape, and may or may not be symmetrical; it suffices that it can be fitted on the casing.

BRIEF DESCRIPTION OF THE DRAWINGS

The description given hereinbelow, by way of non-limiting illustration, of several embodiments will permit a better understanding of the invention, with reference to the attached drawing.

In this drawing.

DETAILED DESCRIPTION OF THE INVENTION

Figure 1:
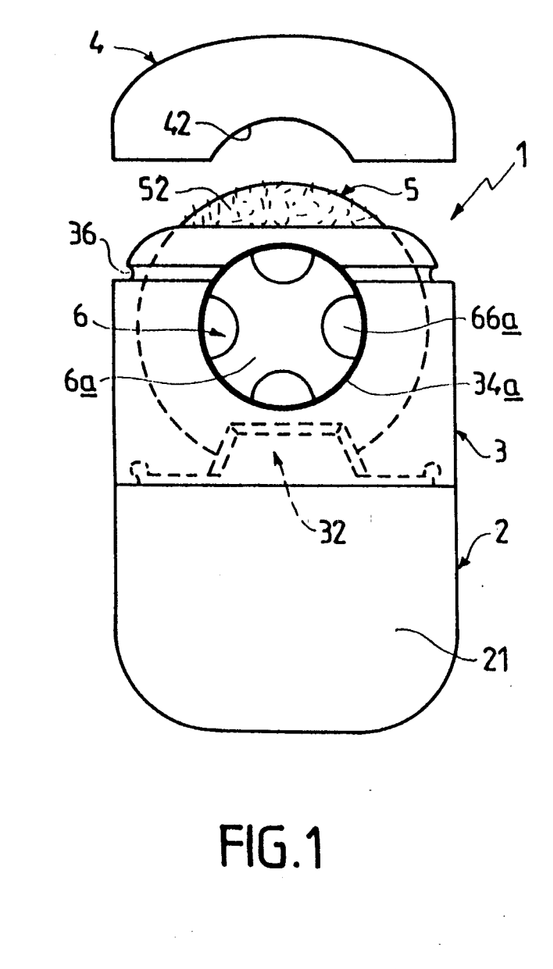
FIG. 1 is a front view of a first embodiment of the assembly according to the present invention.
Figure 2:
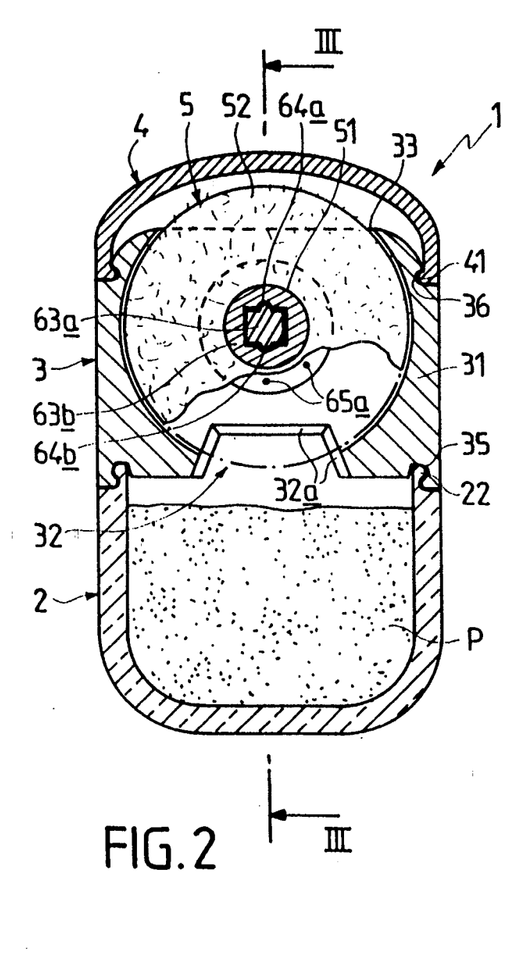
FIG. 2 shows a cross-section of the assembly in FIG. 1.
Figure 3:
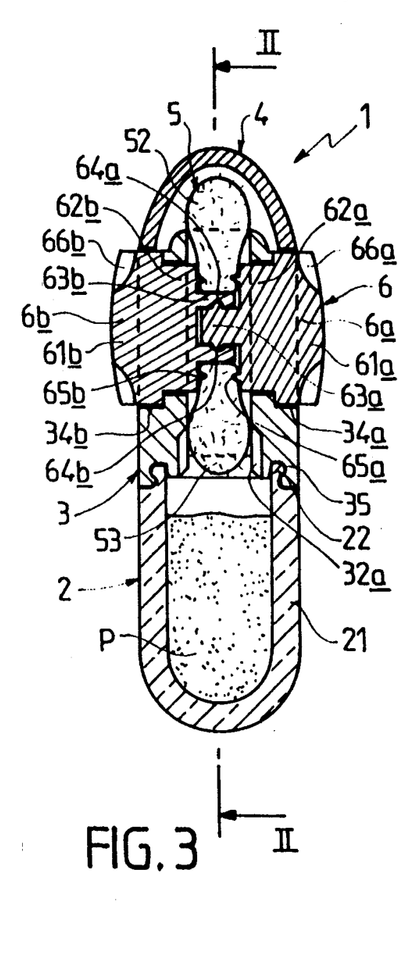
FIG. 3 is a section along III—III in FIG. 2.
Figure 4:
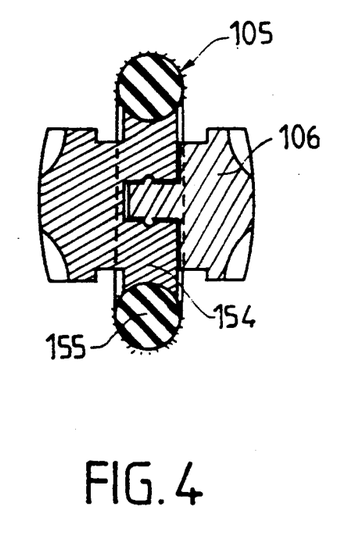
FIGS. 4 to 7 show different embodiments of the applicator device according to the invention.

The applicator assembly shown in Figures 1 to 3 is designated overall by reference 1. It consists of a container 2, a casing 3 and a cap 4. The casing 3 supports an applicator disc 5 rotating about a spindle 6. The container 2 is a cylinder of quasi-rectangular cross-section limited by two plane parallel side walls 21 and open at its upper part (in the position shown in FIGS. 1 to 3). The edge of the container is equipped with a snap-fitting means 22 cooperating with a corresponding means 35 on the casing 3. The container holds a powder product P, if appropriate mixed with a binder in such a way as to facilitate compacting; the container 2 can of course be packaged in the manner of a refill.

The casing 3 consists of a shell 31 whose outer side walls are in the line of those of the container 2. Formed in this casing 3 is a cylindrical space, of circular cross-section, coaxial with the applicator disc 5 and the spindle 6, having dimensions allowing it to match neatly the shape of the applicator disc 5. Provided on the lower edge of the shell 31 of the casing is an inner opening 32 which establishes a communication between the container 2 and the inner cylindrical space of the shell 31 of the casing 3. This opening 32 comprises notches, formed in the plane side walls of the shell 31, which have a trapezoidal shape. Over the entire perimeter of the opening 32, the edge 32a has the shape of a bevel inclined from the outside towards the inside. At its upper part, the casing 3 has an outer opening 33 of rectangular shape. Formed in the shell 31 are two circular slots 34a and 34b for the passage and fixing of the rotation spindle 6 of the applicator disc 5, as explained hereinbelow. Inside the wall of the shell 31, these slots 34a, 34b consist of two sections of different diameters, separated by a shoulder, the section of smaller diameter opening out in the cylindrical space of circular cross-section. Provided on the upper part of the casing, around the outer opening 33, is a means for fixing the cap 4, consisting of a snap-fitting means 36 cooperating with a corresponding means 41 on the cap 4.

In the embodiment shown in FIGS. 1 to 3, the applicator disc 5 is entirely made of flexible, fully flocked foam. It is provided at its center with a circular opening 51 for the passage of the spindle 6. The disc 5 has dimensions such that, when it is fitted in the casing 3, a segment 52 emerges from the casing 3 through the opening 33, and a segment 53 of the disc is arranged in the opening 32 in line with the trapezoidal notches.

The spindle 6 consists of two elements 6a and 6b engaging in one another. Each of these elements is made up of three successive parts of decreasing cross-section: a hurled wheel 61a, 61b of circular cross-section, a flange 62a, 62b of circular cross-section and a pin 63a, 63b. The pin 63a of the element 6a is solid and has, in cross-section, a square shape. It engages in the hollow pin 63b which comprises an indentation having a square cross-section corresponding to that of the pin 63a. The pin 63a is fixed in the pin 63b by means of a double snap-fit system with rib 64a and groove 64b. The flanges 62a and 62b have axial spikes 65a and 65b which engage in the flexible foam constituting the disc 5 and which prevent any relative rotation of the disc 5 with respect to the spindle 6 when the assembly is fitted. The flanges 62a and 62a are partially arranged in the section of smaller diameter of the slots 34a and 34b. The hurled wheels 61a and 61b are partially arranged outside the slots 34a, 34b in the section of greater diameter of the said slots and they bear on the shoulder between the two sections of different diameter of the slots 34a and 34b. Thus, when the two elements 6a, 6bare engaged, the spindle 6 is positioned and held axially; the hurled wheels 61a and 61b are provided externally with four nicks 66a which facilitate the manual action of the user on each of the knurled wheels.

The cap 4 is fixed on the upper part of the casing 3 in such a way as to protect the segment 52 of the applicator device 5 emerging from the opening 33 of the casing 3; on its faces continuing the parallel walls 21 of the container 2, the cap 4 has notches 42 in the shape of an arc of a circle, in which notches the hurled wheels 61a, 61b bear in the closure position of the cap 4.

The assembly 1 functions in the following manner. When the users desire to remove a powder P, for example, held in the container 2, they take off the cap and turn the assembly I over so that the powder P comes into contact with the segment 53 of the disc 5 by gravity. They then rotate one of the hurled wheels 61a or 61b a half turn, in one direction or the other, in such a way that the part of the disc forming the segment 53 takes up the position corresponding to the segment 52 in the opening 33. During rotation, the disc packs the powder between the inclined edges 32a. The product is thus compacted on the applicator 5. In order to apply the powder, the user uses the segment 52 emerging from the casing 3 as an applicator. It will be understood that by turning the disc about a greater or lesser angle, it is possible to meter, as desired, the quantity of product present on the emerging segment 52. By virtue of the elasticity of the perimeter of the foam disc 5, the contact between the disc 5 and the edge of the opening 32 is sufficiently tight to ensure that there is no risk of powder escaping from the container during its storage and when the assembly is turned over to bring the product into contact with the segment 53 of the disc.

Figure 5:
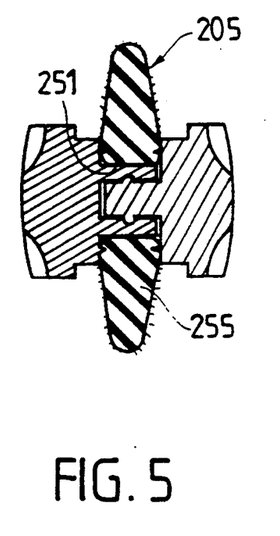
Figure 6:
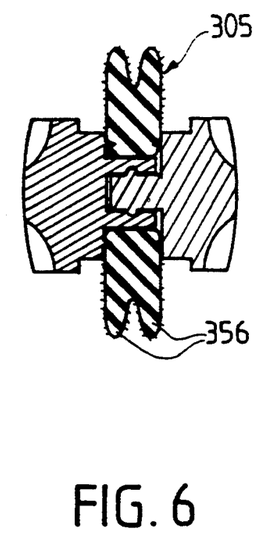
Figure 7:
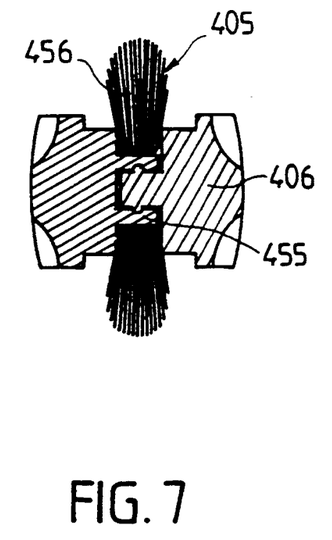

FIGS. 4 to 7 show different embodiments of the applicator disc according to the invention. According to FIG. 4, the disc 105 consists of a hub 154 integral with the spindle 106 on which an O-ring 155 of flocked flexible foam is fixed. In FIG. 5, the disc 205 is likewise made of flocked flexible foam 255 but is thicker in the vicinity of the central opening 251 than at its periphery. According to FIG. 6, the disc 305 forms two lips 356 at the periphery. According to FIG. 7, the disc 405 consists of a hub 455 integral with the spindle 406 on which flexible hairs 456 are radially fixed, which hairs can be natural or synthetic, for example of natural or synthetic elastomer.

The applicator device is not of course limited to the forms and embodiments described hereinabove and illustrated; it will be understood that, to implement the invention, it suffices for the applicator device to be integral with a rotation spindle and to consist at least of one material having a certain flexibility with an open-cell surface in which the product to be applied is compacted; such a material is, for example, a flexible elastomer having a Shore A hardness of the order of 15 to 70; the elastomer can be vulcanizable, such as a silicone, an EPDM (terpolymer of ethylene, propylene and a diene), a latex or the like, or thermoplastic, such as a polyurethane, a polyether, an EVA (ethylene vinyl acetate copolymer) or the like; the open cells on the surface can be micro-craters or radial micro-striae which are concentric, helical or otherwise, or are obtained by flocking with the aid of wires made of rayon, cotton, nylon or the like, having a length of one to fifteen tenths of a millimeter and a diameter of the order of three hundredths of a millimeter. The material for the applicator device can also be a foam: the foam, made of synthetic or natural elastomer, can be open-cell or closed-cell; when the foam is of the closed-cell type, the elements used for forming the applicator device are obtained by slicing a cylindrical bar made of such a foam, an operation of this type opening up the closed surface cells of the foam.

The applicator device can also be composite: thus, when the foam hereinabove is of the closed-cell type, it can be covered on one of its transverse faces by a fabric, an elastomer, a flocking, the covering thus formed constituting the transverse surface of application of the applicator device; of course, the coverings on the two application surfaces of the applicator device can be the same or different$ the said coverings can also be associated with an open-cell foam: this makes it possible to confer upon the applicator device, if necessary, a different flexibility from that obtained with a closed-cell foam; in order to adjust the flexibility of the applicator device to a desired value, it is also possible to provide in situ stiffening elements in order to limit the deformation of the applicator device during application of the product.

Figure 8:
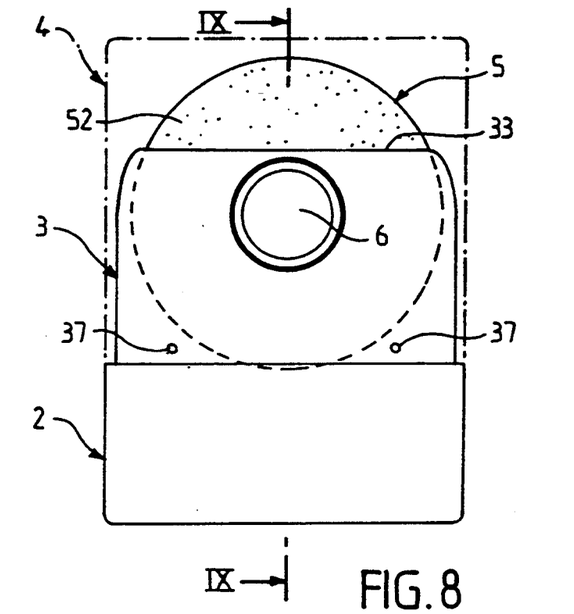
FIG. 8 shows, diagrammatically, in a front view, another embodiment of an assembly according to the present invention.
Figure 9:
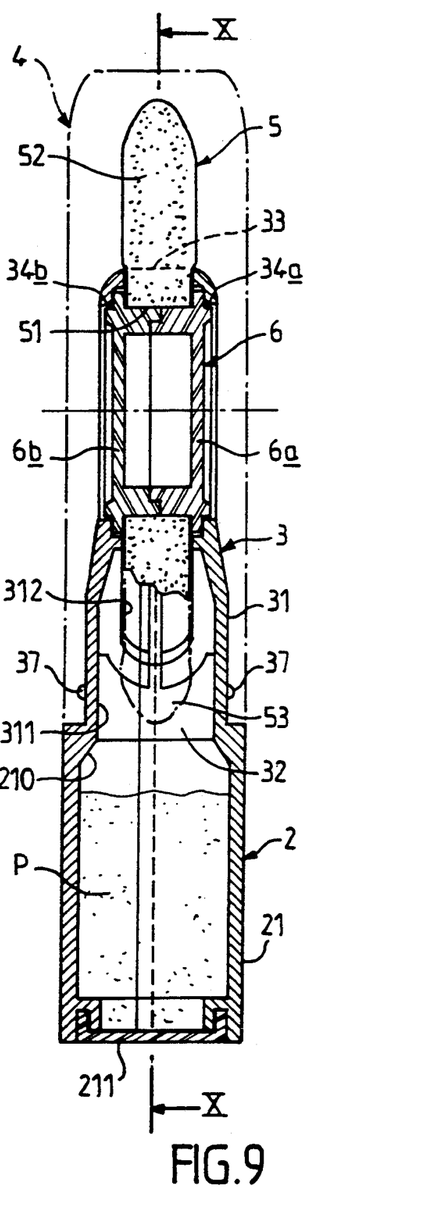
FIG. 9 is a section along IX—IX in FIG. 8, on a larger scale.
Figure 10:
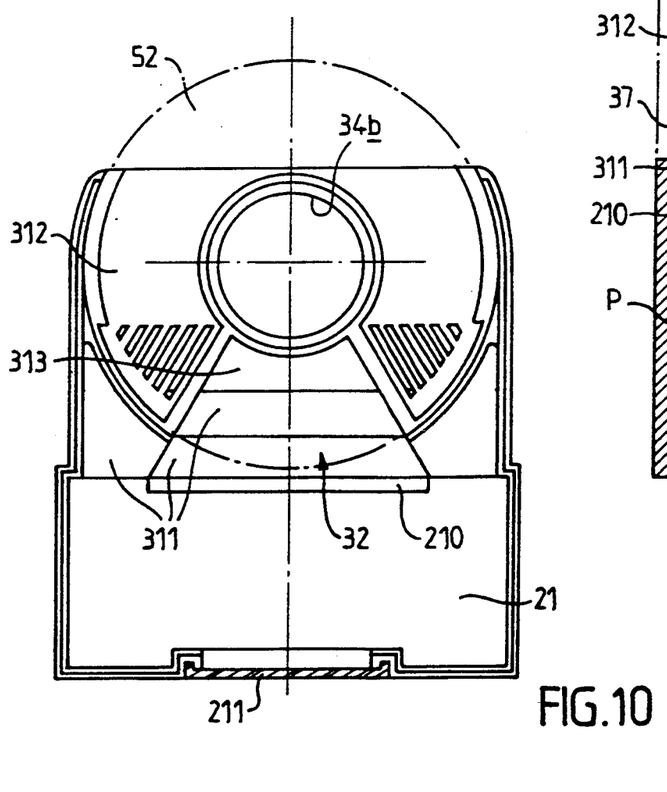
FIG. 10 is a partial section, along X—X in FIG. 9, on a different scale.

FIGS. 8 to 10 show another embodiment of an assembly according to the invention; in these figures, the same reference numbers have been used to designate pieces or parts of pieces which are identical or have the same role; these will not therefore be described in full. According to this embodiment, the sub-assembly formed by the container 2 and the casing 3 is made in two pieces which are substantially symmetrical and are joined along a transverse joint plane with respect to the spindle 6; this assembly method is carried out after putting the applicator device 5 and the elements 6a, 6b forming the spindle 6 into place; a stopper 211 at the lower part of the container 2 makes it possible for the latter to be filled with and/or emptied of product P; a cap 4 closes the assembly, the cap 4 being held by snap-fit spikes 37 (FIG. 8) supported by the casing 3; a mirror (not shown) bonded on the outer surface of the cap 4 facilitates the make-up operation when the product P is a make-up product; the cap 4 comprises vents (not shown) which facilitate its positioning, preventing a "piston" effect.

Figure 16:
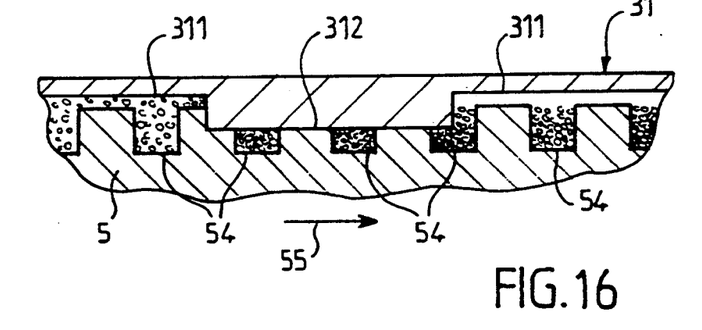
FIG. 16 is a partial sectional view showing the functioning of an assembly according to the invention, explained with reference to the variant in FIGS. 8 to 10, the section being made circumferentially and perpendicular to the plane of FIGS. 8 and 10.
Figures 17, 18:
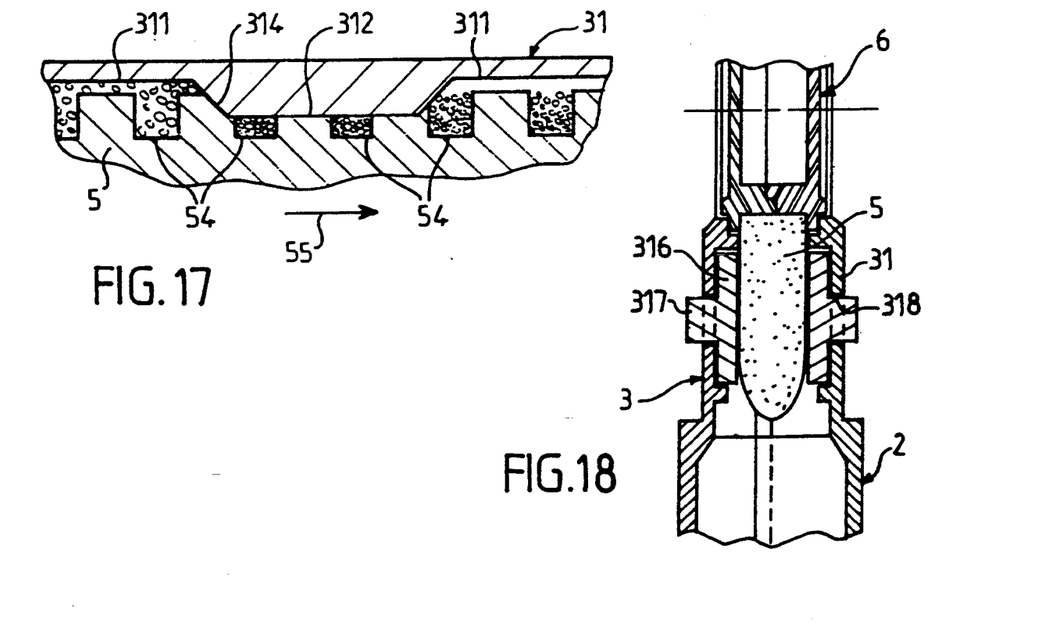
FIG. 17 is similar to FIG. 16 but corresponds to a variant of the shell.
FIG. 18 is a partial section similar to FIG. 9 but shows a variant.

One of the two components constituting in part the container 2 and in part the casing 3 can be seen more clearly in FIG. 10; these components can be made by moulding of any suitable plastic material, which may if appropriate be transparent; such a material can be a polypropylene, a polyacetyl, a polyester; advantageously it is possible to add thereto a lubricating agent such as molybdenum disulphide, minimizing the friction in the prestressing zone described hereinbelow; it can also be polytetrafluoroethylene; the wall 21 delimiting the container 2 is continued, beyond the inner opening 32, along the shell 31 of the casing 3 which comprises portions 311 which are placed, with respect to the plane in FIG. 10, slightly above the wall 21, and a zone 312 which is placed, with respect to the same plane, above the portions 311; inclined walls 313 and 210 locally connect the portions 311, respectively, to the zone 312 and to the wall 21; thus, as can be seen in FIG. 9, when the assembly is mounted, the facing zones 312 are at a distance from one another which is smaller than the axial thickness of the flexible applicator device 5, the thickness being measured when the applicator device 5 is free, not in use, which is that, in particular, of the portion of the segment 52 which extends outside the outer opening 33; the applicator device 5 is consequently compressed in the line of the zones 312; thus, when the applicator device 5 is rotated by means of its spindle 6 in the direction of the arrow 55 in FIG. 16, the open cells 54 and the adjoining product are compressed on passing the zone 312, and the product is compacted in the cells 54 on leaving the zone 312, the cells 54 then return to their initial shape by virtue of the shape memory of the material constituting the applicator device; FIG. 17 shows a variant in which this compression is effected progressively by virtue of the existence of a gradual inclined connection piece 314 between the plane portion 311 and the zone 312.

Figure 11:
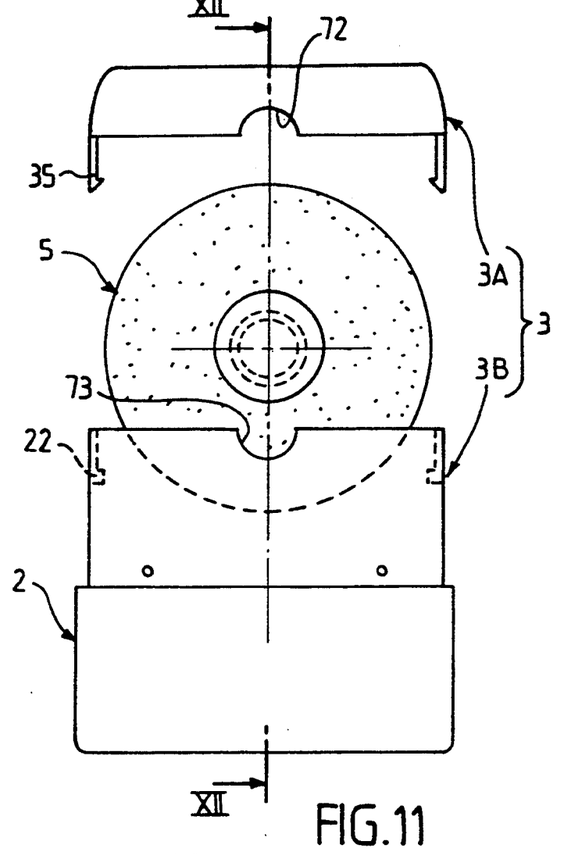
FIG. 11 is an exploded partial view of another embodiment of an assembly according to the invention.
Figure 12:
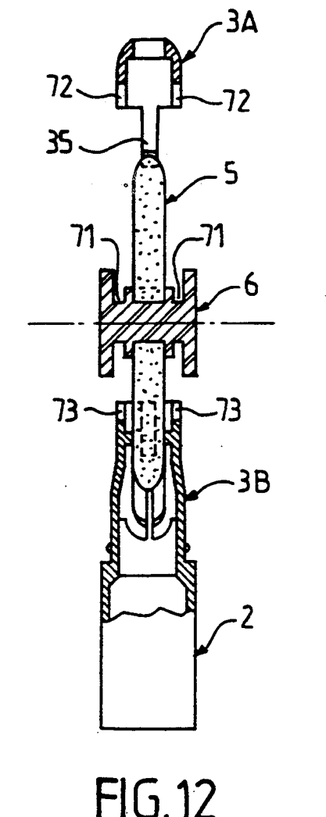
FIG. 12 is a sectional view along XII—XII in FIG. 11.

According to the variant in FIGS. 11 and 12, the casing 3 is made in two parts 3A and 3B which can be assembled using snap-fitting means 35 and 22; the side walls of the two part; 3A and 3B have notches 72 and 73, respectively, whose edges cooperate with bearing grooves 71 on the spindle 6; in this way the applicator device 5 is easily interchangeable.

Figure 13:
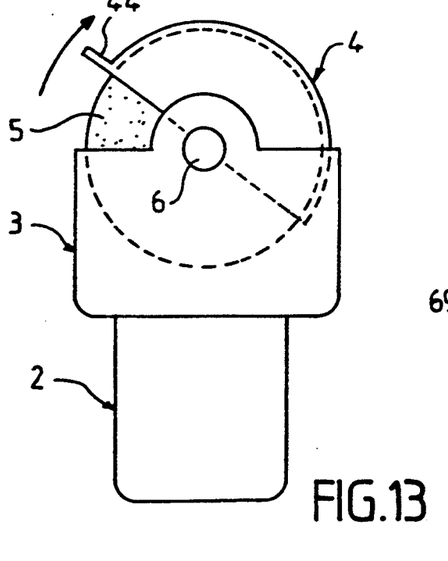
FIG. 13 is similar to FIG. 8, but shows a variant.

According to FIG. 13, the cap 4 of semi-cylindrical shape is, like the applicator device 5, integral with the spindle 6; a radial grip tongue 44 makes it possible to open and close the cap 4 by rotation; during these rotational movements, the applicator device 5 is charged with product, as described hereinabove; it will be understood that, in such an embodiment, it is not necessary for the applicator device 5 to be a complete disc: it can in fact be limited to a semi-circular segment or sector.

Figure 14:
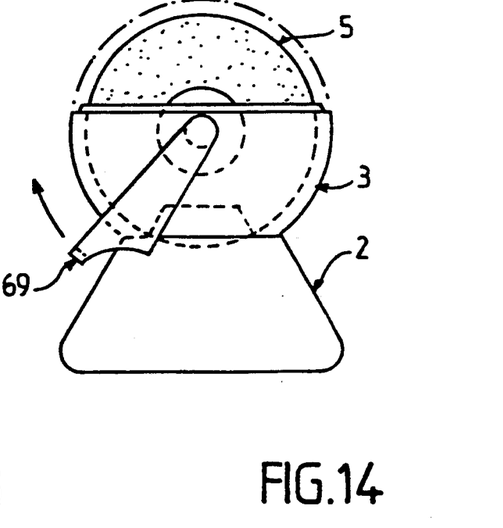
FIG. 14 is similar to FIG. 13, but shows another variant.
Figure 15:
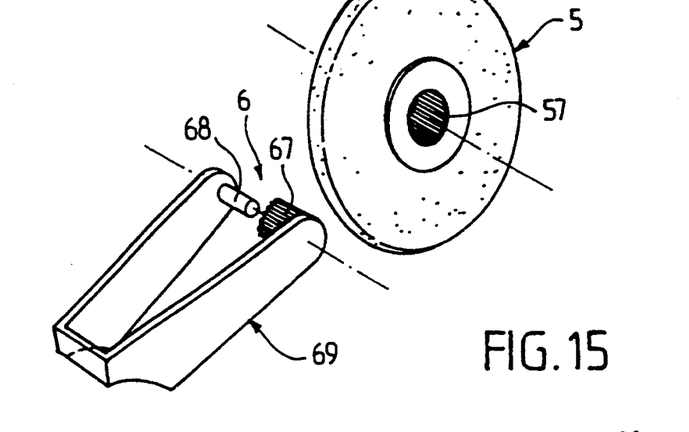
FIG. 15 is an exploded view showing a construction detail of the variant in FIG. 14, on a larger scale.

According to the variant in FIGS. 14 and 15, the means for activating the applicator device 5 is an external lever 69 of U-shape whose branches have at their ends, on the one hand, external teeth 67 and, on the other hand, a clip stud 68; the external teeth 67 constitute the spindle 6 and receive the internal teeth 57 of the disc-shaped applicator device 5 before closure of the lever 69 by clipping of the stud 68.

FIG. 18 shows a variant in which the constriction of the applicator device 5 is obtained by arranging pressure plates 316 between the applicator device 5 and the walls of the shell 31; the pressure plates 316 are integral with a push-button 317 passing through the passages 318 formed in the walls of the shell 31; thus, by adjusting the pressure on the push-buttons 317, the user can vary, as desired, the constraint on the applicator device 5. According to a variant (not shown), the pressure plates 316 do not have a push-button and are mounted in the shell in the manner of shims: thus, by constructional means, it is possible, by choosing the thickness of a plate, to vary the prestressing of the applicator device and to fix this prestressing at a desired value simply by changing the pressure plate.

According to another variant (not shown), the container is divided into two compartments by a partition extending in the plane of the applicator device, the two compartments containing two different products, each being connected to one of the surfaces of the applicator device.

I claim:

1. Applicator assembly for a cosmetic product, comprising a container holding the product, and an applicator device having at least one circular segment made of flexible material, said applicator device being integral in terms of rotation with a spindle adapted to be rotated about a rotational axis in a casing from the outside, means for activating the applicator device in rotation, said casing being integral with the container holding the product, and having two openings, an inner opening establishing a communication between the container and the casing, and an outer opening which opens towards the outside, said applicator device being mounted movably between at least two positions, one position allowing the segment to come into contact with the product held in the container, and another position in which the segment, charged with product, is at least partially brought into line with the outer opening so as to emerge from the casing, and serve for application of the product, said applicator device adapted to pack the product as said applicator device rotates from one to the other of said positions, whereby the product is compacted on the applicator device, and said applicator device being at least partially compressed in a direction parallel to the rotational axis of the spindle in a zone between the inner opening and outer opening.

2. Applicator assembly according to claim 1, wherein the casing comprises a shell having side walls which are, in line with the zone, at a distance from one another which is smaller than the axial thickness of the segment, said thickness being measured when the applicator device is free, not in use.

3. Applicator assembly according to claim 1, wherein the casing comprises a shell, and at least one pressure plate is arranged axially between a side wall of the shell and the segment of the applicator device.

4. Applicator assembly according to claim 3, wherein the pressure plate is integral with a push-button passing through the side wall of the shell.

5. Applicator assembly according to claim 1, wherein the casing comprises a shell, said inner opening being formed on a lower edge of the shell and comprising notches formed in side walls of the shell, said lower edge having the shape of a bevel inclined from the outside towards the inside over the entire perimeter of the inner opening, said segment being arranged in line with said notches.

6. Applicator assembly according to claim 1, further comprising a cap fitted on the casing.

7. Applicator assembly according to claim 6, wherein the activating means is the cap, fitted rotatably and integral with the applicator device.

8. Applicator assembly according to claim 1, wherein the applicator device consists entirely of a flexible foam.

9. Applicator assembly according to claim 8, wherein the flexible foam surface of the applicator device is at least partially flocked.

10. Applicator assembly according to claim 1, wherein the applicator device is made of a semi-flexible thermoplastic which has undergone a surface flocking treatment.

11. Applicator assembly according to claim 1, wherein the applicator device consists of a circular hub of rigid material, on which a ring of flexible foam is fixed.

12. Applicator assembly according to claim 11, wherein the flexible foam surface of the applicator device is at least partially flocked.

13. Applicator assembly according to claim 1, wherein the applicator device consists of a hub of rigid material on which flexible hairs are radially fixed.

14. Applicator assembly according to claim 1, wherein the means for activating the applicator device in rotation comprise at least one knurled wheel integral with the spindle arranged at least partially outside the casing.

15. Applicator assembly according to claim 1, wherein the activating means is an external lever.

16. Applicator assembly according to claim 15, wherein the casing is made in two parts, and the applicator device is removably mounted.

* * * * *